(12) United States Patent
Odake et al.

(10) Patent No.: US 6,426,595 B1
(45) Date of Patent: *Jul. 30, 2002

(54) FLAT DISPLAY APPARATUS

(75) Inventors: Ryota Odake, Tokyo; Yoshio Suzuki; Atsushi Matsuzaki, both of Kanagawa, all of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/499,542

(22) Filed: Feb. 7, 2000

(30) Foreign Application Priority Data

Feb. 8, 1999 (JP) .......................................... 11-030465

(51) Int. Cl.[7] ................................................. G09G 3/10
(52) U.S. Cl. ....................... 315/169.1; 345/55; 345/204
(58) Field of Search .......................... 315/169.1, 169.2, 315/169.3; 445/24; 345/204, 211, 55, 214, 76, 77

(56) References Cited

U.S. PATENT DOCUMENTS

| | | | | |
|---|---|---|---|---|
| 4,702,560 A | * | 10/1987 | Endo et al. .................. | 340/784 |
| 4,801,933 A | * | 1/1989 | Yamamoto et al. .......... | 340/784 |
| 5,157,387 A | * | 10/1992 | Momose et al. ............. | 340/784 |
| 5,703,615 A | * | 12/1997 | Usami .......................... | 345/97 |
| 5,764,225 A | * | 6/1998 | Koshobu ...................... | 345/211 |
| 5,874,933 A | * | 2/1999 | Hirai et al. ................... | 345/89 |

* cited by examiner

*Primary Examiner*—Don Wong
*Assistant Examiner*—Thuy Vinh Tran
(74) *Attorney, Agent, or Firm*—Frommer Lawrence & Haug LLP; William S. Frommer

(57) ABSTRACT

A flat display apparatus having improved luminance, contrast and response of display, and applicable for assembling a large flat display apparatus free from the discontinuity of display and having improved luminance, contrast and response of display. The flat display apparatus includes a plurality of signal electrodes divided into at least three regions; a plurality of scanning electrodes intersecting to the plurality of signal electrodes; and a plurality of displaying signal supplying circuits for independently supplying display signals to the signal electrodes in each divided region. The flat display apparatus may include a display panel in which a plurality of signal electrodes and a plurality of scanning electrodes are intersected. The signal electrodes are divided into two or more regions, and a plurality of feeding portions for supplying signal to the signal electrodes are provided on a rear surface of the display panel.

4 Claims, 10 Drawing Sheets

FLAT DISPLAY APPARATUS

BACKGROUND OF THE INVENTION

1. Field of the Invention

The present invention relates to a flat display apparatus, more particularly, a flat display apparatus having a plurality of picture elements arranged in a matrix form, the picture elements being formed by organic electroluminescence devices, field luminous devices and so on, and having special featured electrode structures.

2. Description of the Related Art

In a flat display apparatus, a plurality of flat display elements are driven by electrodes arranged in two dimensional directions. When driving such the flat display apparatus, for example, a flat display apparatus 100a as shown in FIG. 1, by a single matrix driving method (a passive matrix method) to lengthen a selection time of row electrodes (scanning electrodes) 100b, specifically to lengthen the selection time by double, column electrodes (signal electrodes) 100c are divided into two regions of upper portion and lower portion and the divided column electrodes are supplied with individual display signals. The reason of adopting the two division driving method is based upon a structural restriction that drive circuits which supply the display signals to the divided column electrodes can only connect to the column electrodes from the both upper and lower ends.

In such the simple matrix drive methods of the flat display apparatus 100a in which the column electrodes are divided into upper and lower regions, the lengthening of the selection time of the row electrodes 100b are limited up to double and it suffers from the disadvantage of the limitation of the lengthening of the selection time of the row electrodes 100b. This means, compared with the active matrix type display apparatus wherein many active elements of TFT (thin film transistor) are employed, the flat display apparatus 100a of FIG. 1 has low luminance of the display apparatus, low contrast, and low response. Further, when a large flat display apparatus is constructed by arranging such the flat display apparatuses like the arrangement of assembled tiles, the column electrodes (signal electrodes) 100c are divided into two regions of upper and lower portions and the drive circuits 100d are connected to those column electrodes 100c to supply the display signals to the column electrodes from upper and lower both ends of the flat display apparatus. In such case, a space (flame) is needed for arranging the drive circuits 100d around the large flat display apparatus. Such space (flame) causes the discontinuity at the boundaries of the adjacent display apparatuses in the large flat display apparatus.

SUMMARY OF THE INVENTION

An object of the present invention is to provide a flat display apparatus having a high luminous, a high contrast, and a high speed response.

Another object of the present invention is to provide a large flat display apparatus assembled a plurality of flat display apparatuses and free from the discontinuity on the display.

According to the present invention, there is provided a flat display apparatus including a plurality of signal electrodes divided into at least three regions; a plurality of scanning electrodes intersecting to the plurality of signal electrodes; and a plurality of displaying signal supplying circuits for independently supplying display signals to the signal electrodes in each divided region.

A selection time of the scanning electrode may be defined by the division of the signal electrodes so that the selection time is longer than that of a flat apparatus in which a plurality of signal electrodes are not divided or are divided into two regions.

Preferably, a plurality of feeding portions are provided on a rear surface of a display panel of said flat display apparatus and used for supplying signals to the signal electrodes in each divided region therethrough, and wherein drive circuit are connected to the corresponding signal electrodes in each region at the feeding portions.

Also preferably, a plurality of feeding portions are provided on the rear surface of a display panel of said flat display apparatus and used for supplying signals to the signal electrodes in each divided region therethrough, and wherein drive circuit are connected to the corresponding signal electrodes in each region at the feeding portions.

According to the present invention, there is also provided a flat display apparatus comprising a display panel in which a plurality of signal electrodes and a plurality of scanning electrodes are intersected. The signal electrodes are divided into two or more regions, and a plurality of feeding portions for supplying signal to the signal electrodes are provided on a rear surface of the display panel.

According to the present invention, there is further provided a flat display apparatus comprising a display panel in which a plurality of signal electrodes and a plurality of scanning electrodes are intersected. The signal electrodes are divided into two or more regions, a plurality of feeding portions for supplying signal to the signal electrodes are provided on a rear surface of said display panel, and a plurality of drive circuits for supplying the signals to said signal electrodes through the feeding portions are provided on the rear surface of said display panel.

BRIEF DESCRIPTION OF THE DRAWINGS

These and other objects and features of the present invention will be clearer from the following description of the preferred embodiments given with reference to the accompanying drawings, in which.

DESCRIPTION OF THE PREFERRED EMBODIMENTS

Preferred embodiments of the flat display apparatuses according to the present invention will be described with reference to the accompanying drawings.

A first embodiment of the flat display apparatus of the present invention will be described with reference to FIGS. 2 to 6. The first embodiment of the flat display apparatus is an organic-electroluminescence type display apparatus (hereinafter, organic EL display type apparatus) having 480×640 picture elements of VGA displays.

Figure 1:
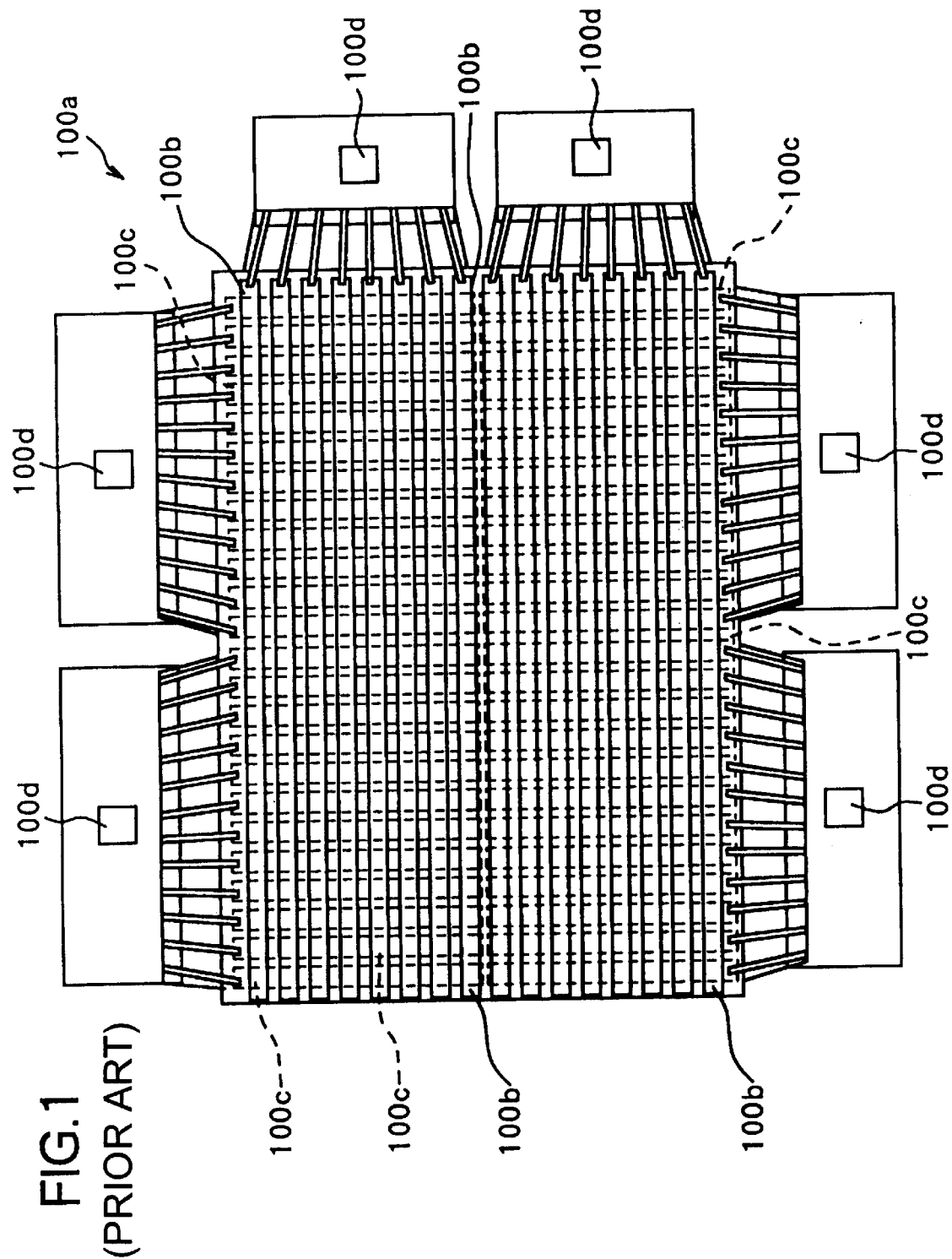
FIG. 1 is a plan view of a flat display apparatus as the related art.
Figure 2:
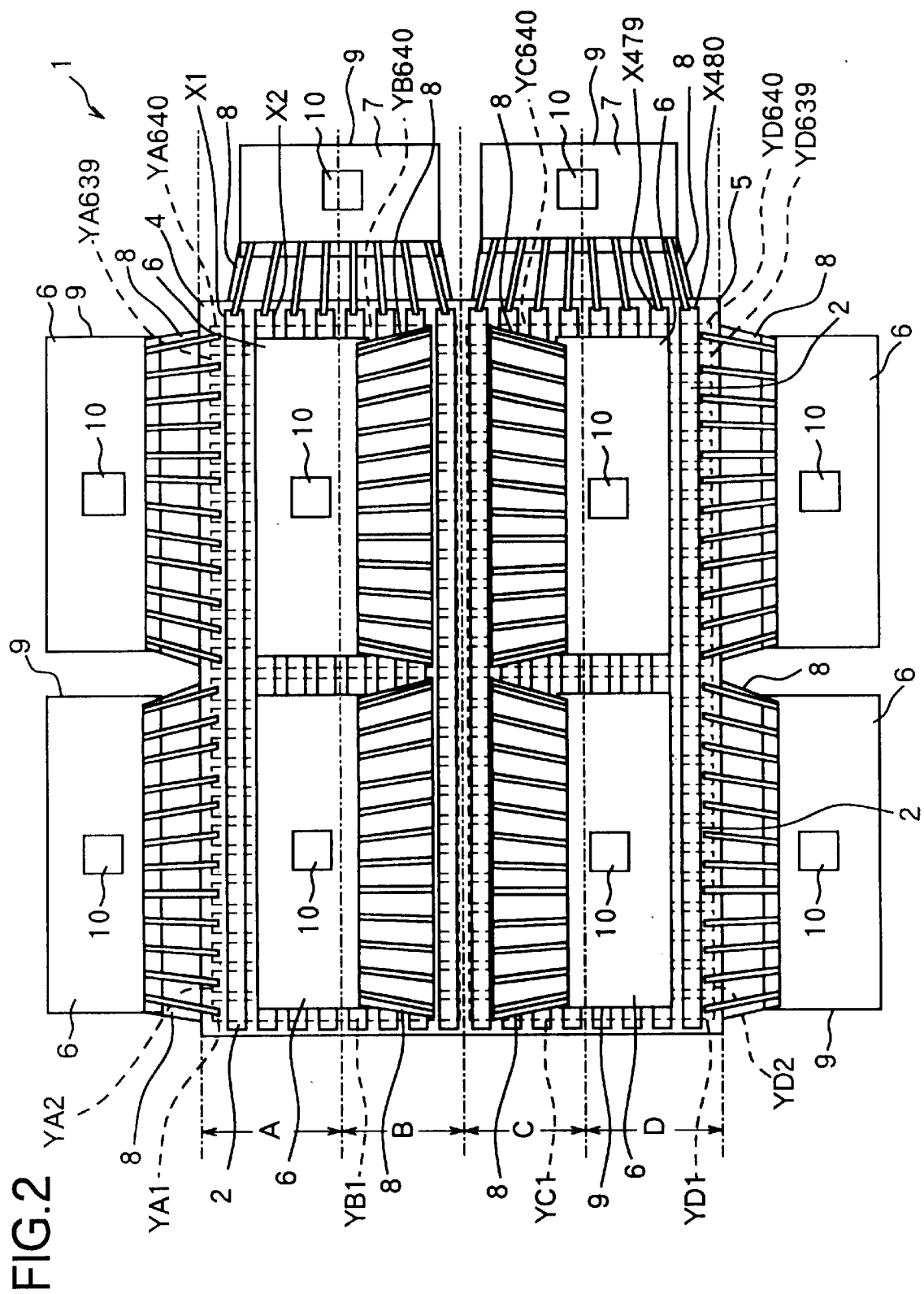
FIG. 2 is a plan view of a flat display apparatus of a first embodiment in accordance with the present invention.

The organic EL display apparatus 1 shown in FIG. 2 comprises a plurality of monochrome type organic EL cells where a plurality organic EL devices 2 are arranged in a cell structure, and the organic EL devices 2 correspond to 480×640 picture elements.

Figure 3:
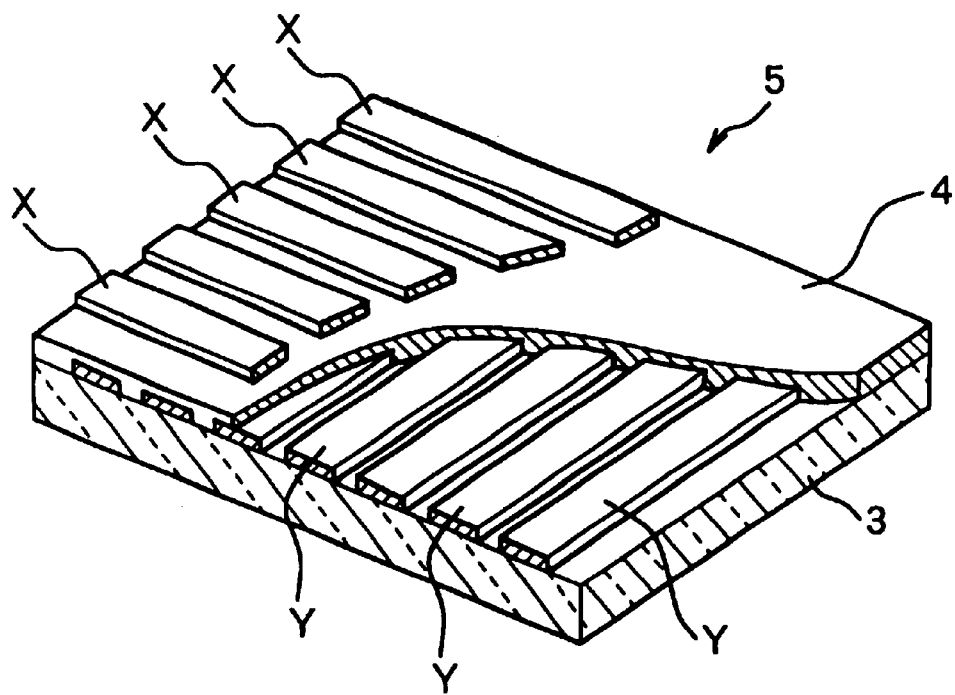
FIG. 3 is a perspective and semi-sectional view of a part of the flat display apparatus shown in FIG. 1, especially illustrating the structure of column electrodes and row electrodes.

FIG. 3 shows a part of such cell structure. An organic EL display apparatus 5 comprises a plurality of column electrodes (signal electrodes) Y arranged in a stripe like pattern, formed on a glass substrate 3, formed by transparent electrodes such as ITO and having the film thickness of several hundreds Å to several micron meters; and organic layers 4 (electron transportation layer organic) formed around and on those column electrodes Y and having the film thickness of several hundreds Å to several ten micro meters (pm). Further the organic EL display apparatus 5 comprises a plurality of row electrodes (scanning electrodes) X formed on the organic layers 4, and made of some kinds of metal. The row electrodes are arranged in a stripe like pattern and extends in the direction intersecting to the direction of the column electrodes. Namely, the row electrodes and the column electrodes are intersected each other and form a lattice pattern. The organic layer 4 comprises an organic positive-hole transportation layer for transferring positive-holes, an organic light emission layer for emitting fluorescence light and an electron transportation layer for transporting electrons. In FIG. 2, the organic EL display apparatus 1 has four column electrode regions divided the column electrodes Y functioning as the signal electrodes into four blocks in the longitudinal direction and independently operable. Such division of the column electrodes enables the lengthening of the selection time of the row electrodes X functioning as the scanning electrodes, by four times to that of the non-division type column electrodes.

In this embodiment, the number of the division of the column electrodes is four, but the division number can be any value equal or greater than 3.

Referring to FIG. 2, the column electrodes Y are divided into four regions A, B, C, and D from the top to the bottom, on the organic EL Display apparatus 5. Note, the column electrodes Y in the four regions A, B, C and D are respectively labeled as YA1, YA2, . . . , YA640; YB1, YB2, . . . , YB640; YC1, YC2, . . . , YC640; and YD1, YD2, . . . , YD640.

The row electrodes X are labeled as X1, X2, . . . , X480. Note, the arrangement of the row electrodes is not related to the division of the column electrodes.

The column electrode drive circuits 6 are connected to the column electrodes YA1, YA2, . . . , YA640; YB1, YB2, . . . , YB640; YC1, YC2, . . . , YC640; and YD1, YD2, . . . , YD640. The row electrode drive circuits 7 are connected to the row electrodes X1, X2, . . . , X480.

The column electrode drive circuits 6 and the row electrode drive circuits 7 are provided by connecting flexible printed circuit wiring boards (FPCs) 8 to printed wiring boards (PBSs) 9 by anistropy conductive films (ACFs) or the like. Driver ICs 10 as the drive circuits are mounted on the PWBs 9 by soldering or the like. The column electrode drive circuits 6 and the row electrode drive circuits 7 drive the organic EL display apparatus 5 through the column electrodes and the row electrodes.

The column electrodes YA1, YA2, . . . , YA640 are divided into two blocks at the right and left sides. Other column electrodes YB1, YB2, . . . , YB640; YC1, YC2, . . . , YC640; and YD1, YD2, . . . , YD640 are also divided into two blocks, respectively. Namely, the total column electrodes are divided into eight blocks, and eight column electrode drive circuits 6 are independently connected to the eight column electrode blocks.

The divided four regions of the column electrodes YA1, YA2, . . . , YA640; YB1, YB2, . . . , YB640; YC1, YC2, . . . , YC640; and YD1, YD2, . . . , YD640 must be supplied with the drive signals from the column electrode drive circuits 6, independently. So, holes are perforated to penetrate the organic layer 4 on the display apparatus 5, a protective layer adhesive-mounted thereon and other layer(s), and the connection between, at least the column electrode circuits 6 for the regions B and C and the column electrodes YB and YC is carried out through the holes. Such structure will be described in detail later. Note such structure enables the provision of feeding portions on the rear side of the display apparatus 5.

Such the feeding portion by which the drive signals from the column electrodes drive circuits 6 are supplied to the regions A, B, C, and D, can be positioned at any positions where the connection between the column electrode regions and the column electrode drive circuits can be carried out at the rear side of the organic EL display apparatus 5.

In the organic EL display apparatus 5, the organic layers 4 and the row electrodes X are arranged on the column electrodes Y, thus, the perforation is carried out at the organic layers 4 each positioned between the adjacent row electrodes by a perforator such as an exciter laser apparatus, and the connection between the column electrode drive circuits and the regions is made by thermal press mounting method using the FPCs 8 with bumps through the resultant holes. Namely, the bumps are heated to be a melting condition and are pressed to the regions to connect therebetween. As a result, the length of the connection lines between the respective column electrode drive circuits and the respective column electrodes in each of column electrode regions A, B, C, and D can be shortened.

Note, the formation of the organic layers 4 on the glass substrate 4, is carried out by patterning using a mask to form each organic layer 4 corresponding to each organic EL device 2, then there is not exist any organic layers between the row electrodes, and thus it is not needed the perforation process of the organic layer.

Figure 4:
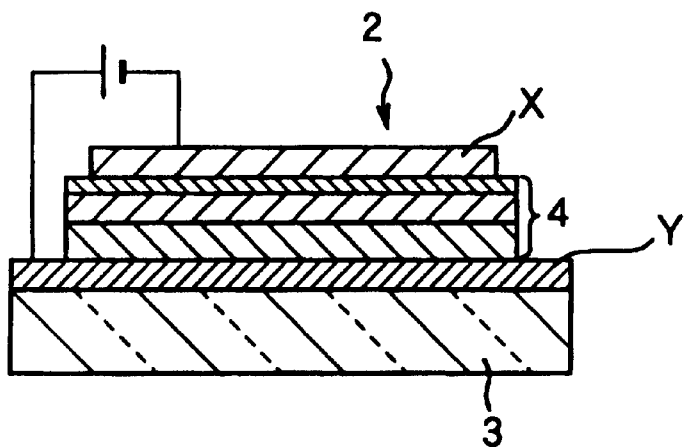
FIG. 4 is a sectional view of the part shown in FIG. 3.
Figure 5:
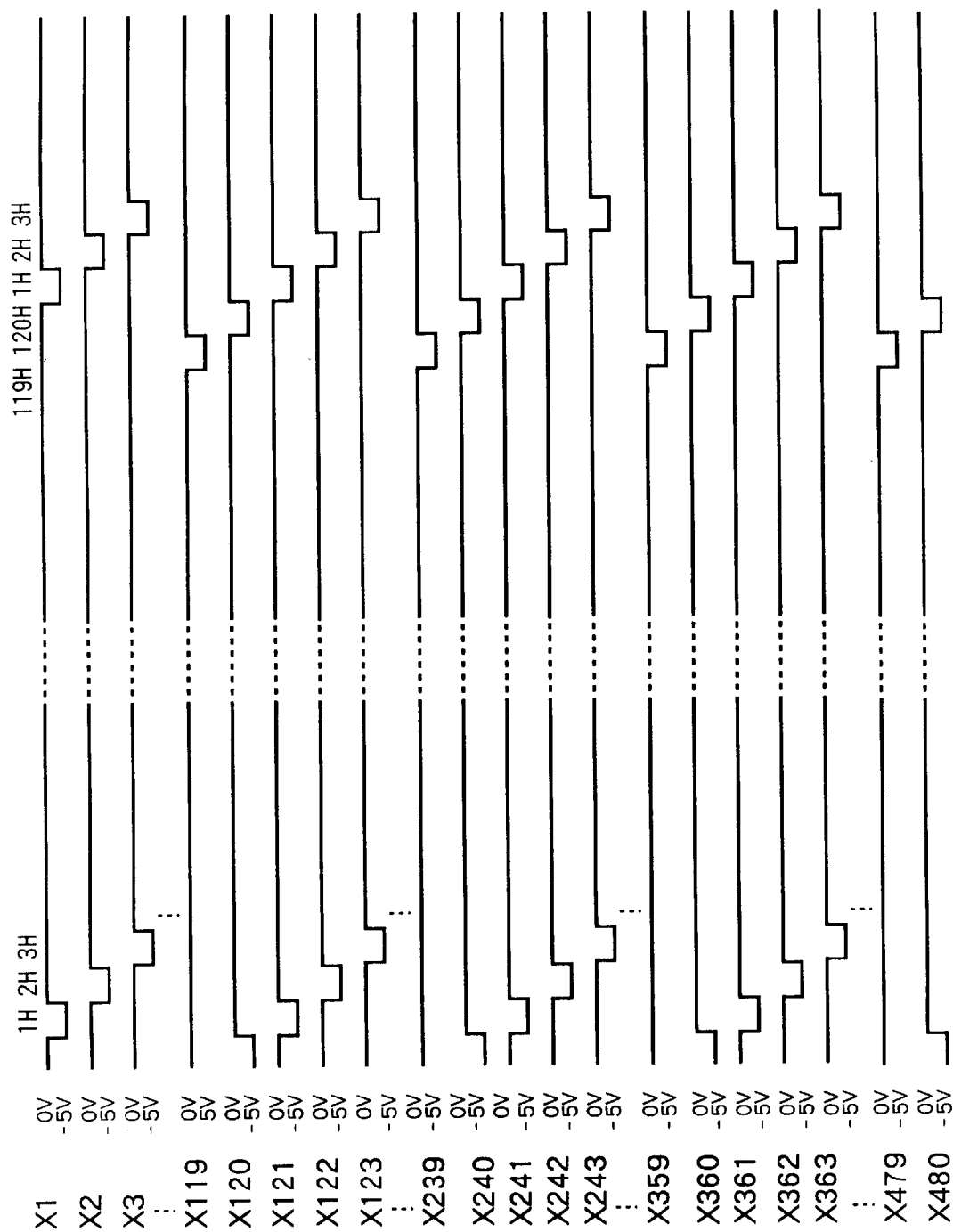
FIGS. 5 and 6 are timing charts for describing the operation of the flat display apparatus shown in FIG. 2.
Figure 6:
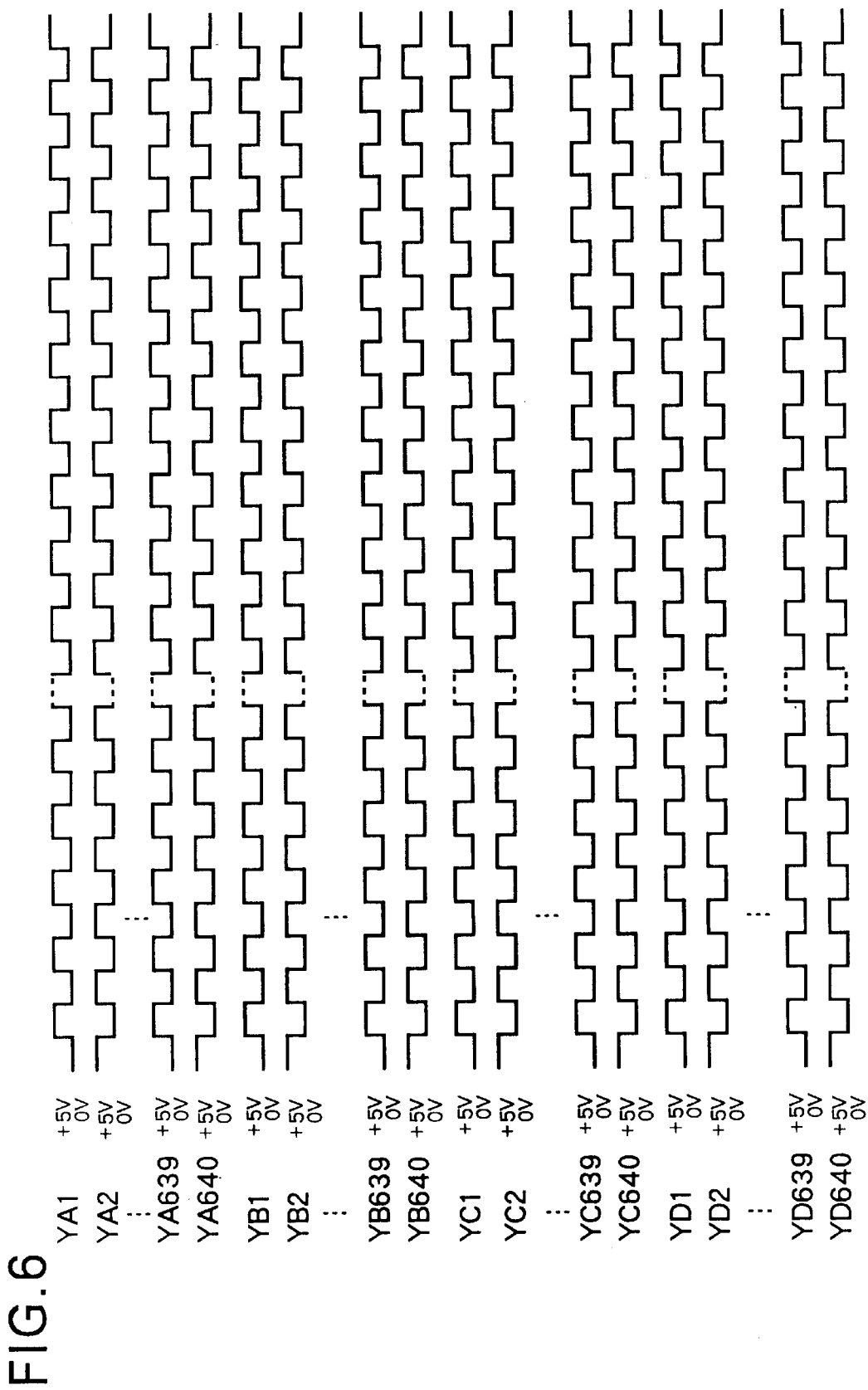

FIGS. 4 and 5 are graphs showing drive wave forms of the organic EL display apparatus 1.

For the simplification of the illustration, the definition of the illumination of the organic EL display apparatus is made that the organic EL display apparatus 1 does not emit light when the voltage of the drive signal is equal or less than 5V, and is brightly lightened when the voltage of the drive signal is 10V.

In the example of the illustration, 0V applied to the row electrodes X1, X2, . . . , X480 is defined as a non-selection voltage, and −5V is defined as a selection voltage. The row electrodes X1, X121, by X241 and X361 are simultaneously applied by the selection voltage (−5V) during 1H (one sweep time of the display panel 5) to be selected for the display panel to be selected for scanning the corresponding picture elements, next, the row electrodes X2, X122, X242 and X362 are simultaneously applied by the selection voltage during a next 1H, and so on. The selection and scanning for the row electrodes X120, X240, X360 and X480 is completed, then, the selection and scanning for the row electrodes X1, X121, X241 and X361 is again carried out, and the above selection and scanning is repeated. In this example, the respective selection time of the row electrodes X1, X2, ..., X480 is 1/120 duty.

The column electrodes YA1, YA2, ..., YA640; YB1, YB2, ..., YB640; YC1, YC2, ..., YC640; and YD1, YD2, ..., YD640 are applied the voltage either a turn-OFF voltage of 0V or a turn-ON voltage of +5V.

A picture element (Xn, Xm) at which a row electrode Xn and a column electrode Ym are intersected is selected when the row electrode Xn is energized by applying the selection voltage (−5V), and is energized by emitted light when the turn-ON voltage (+5V) is applied to the column electrode Ym because the picture element is applied 10V. When the row electrode Xn is not energized and/or when the column electrode Ym is applied the turn-OFF voltage, the picture element (Xn, Ym) is applied the voltage of 5V or 0V and such the picture element (Xn, Xm) cannot be lightened.

$\underline{n}$ indicates the number of the row electrodes X, and n=1 to 480, $\underline{m}$ indicates the number of the column electrodes YA1 to YA640, YB1 to YB640, YC1 to YC640, and YD1 to YD640, and $\underline{m}$=1 to 640.

In the example of the application of the drive voltages to the row electrodes Xn and the column electrodes Ym, the picture elements at the positions of n+m=2p, where p=1, 2, 3, ..., 559, 560, are lightened and the picture elements at the positions of n+m=2p+1, where p=1, 2, 3, ..., 558 and 559, are not lightened.

The illumination response time of the organic EL display apparatus 1 is very short, for example, nano seconds, i.e., the illumination response characteristic of the organic EL display apparatus 1 has a very high speed, and thus, the luminance of the emission light from the organic EL display apparatus 1 is proportional to the duty of the turn-ON voltage when the both of the row electrode and the column electrode are simultaneously applied to the turn-ON voltages. Then, a pulse width modulation (PWM) is applied to a duration where the turn-ON voltage is supplied to the column electrode within one sweep time (1H) to result in a gradational display of the organic EL display apparatus 1.

The duty of the selection time on the row electrode of the two division type display apparatus mentioned as the related art was 1/240. The duty of that of the organic EL display apparatus 1 of the present embodiment is 1/120. Compared with the related art, the organic EL display apparatus 1 improves double on the display luminance.

As described above, the simple matrix drive type flat display apparatus of the present embodiment in which the scanning electrodes (the row electrodes) are sequentially selected in order, enables to extend the selection time of the picture elements, and achieves the improvement of the resultant luminance of the display responsive to the extension of the selection time. The improvement of such luminance may also achieve better contrast ratio of displaying image, because black (bottom) level keeps same luminance while white (peak) level increases the luminance.

In the above embodiment, the four division of the column electrodes was described, but the present embodiment can be applied to a three or more division of the column electrodes.

According to the present embodiment, the connection can be made between the signal electrodes (the column electrodes) in each region which is one of three or more divided regions and the independent drive circuit for those signal electrodes in that region, and the resultant capacitance which includes a parasitic capacitance, of the signal electrodes driven by one drive circuit becomes small. Consequently, an output impedance of driver ICs in the drive circuit becomes high, and the rising time of the drive signal from the drive circuit becomes short. Therefore, the response of the illuminance change of the display screen (or the display panel) to the application of the drive signal is improved.

In the above organic EL display apparatus 1, the display control was made in response to the value of the voltage applied to the electrodes, alternatively, the display control can be made by building a low current supplying circuit into the column electrode drive circuit 6.

The above description was made on the organic EL display apparatus wherein the column electrodes were divided into four regions and the column electrodes in each region are driven by the drive signals from the independent drive circuit for that region, but the present invention is not limited to the four divided regions. The column electrodes can be divided into three, four, six, eight and so on. When the column electrodes are divided into six or eight, the duty of the selection time of the row electrodes becomes 1/80 or 1/60, and the resultant display luminance is improved.

A second embodiment of the first display apparatus according to the present invention will be described with reference to FIGS. 7 to 9.

In the flat display apparatus of the second embodiment, the signal electrodes (the column electrodes) are divided into two regions, and the feeding portions (feeding points) for the divided signal electrodes are provided on a rear side of the display panel.

Figure 7:
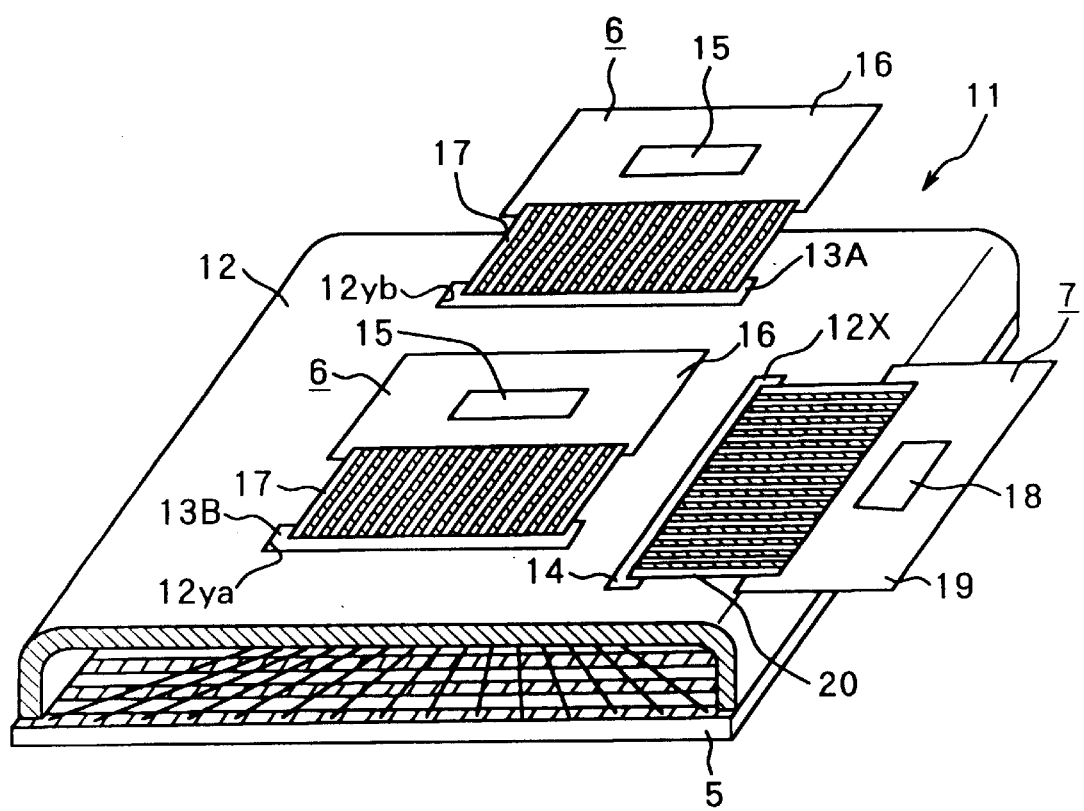
FIG. 7 is a perspective view showing a rear side of a flat display apparatus of a second embodiment according to the present invention.

FIG. 7 is a perspective view of a rear side of an organic EL display apparatus 11.

The rear side of the organic EL display apparatus 11, illustrated at the upper side in FIG. 7, is covered by a sealing cap 12. The cap 12 is made of a member having a high sealing performance, such as aluminum plate, iron plate or glass plate.

FIG. 7 shows a partial section view of the organic EL display apparatus 11.

At the rear side of the organic EL display apparatus 11, connectors 13A and 13B for connecting the column electrode drive circuits 6 to the column electrode YA and YB in the two divided regions, and a connector 14 connecting the row electrode drive circuit to the row electrodes X are exposed through holes 12*ya*, 12*yb* and 12*x*, formed in the cap 12 and having the size as that the connectors 13A, 13B and 14 are fittingly pass therethrough.

The connectors 13A and 13B are connected with column driver boards 16 on which column drive ICs are mounted by the flexible printed circuit cable (FPC) substrates 17.

The connector 14 is connected with a row driver 19 on which two drive ICs 18 are mounted by a FPC substrate 20.

A desiccation (drying) agent and oxidation prevention agent, not shown, are provided inside of the cap 12, by, for example, painting those agents on the inner surface of the cap 12.

In FIG. 7, interest of the illustration, the illustration was made that the FPC connected to the feeding portions, i.e., the connectors project at the side of the display panel, and the drive circuits are positioned at the outer side of the display panel, actually, the FPCs are bent so that the drive circuits are positioned at the rear side of the display panel. Such structure does not generate the spaces (the flames) between the display panels when a plurality of display panels are arranged in the tile assembling manner to construct a large display apparatus, and the resultant continuous image display can be realized.

Figure 8:
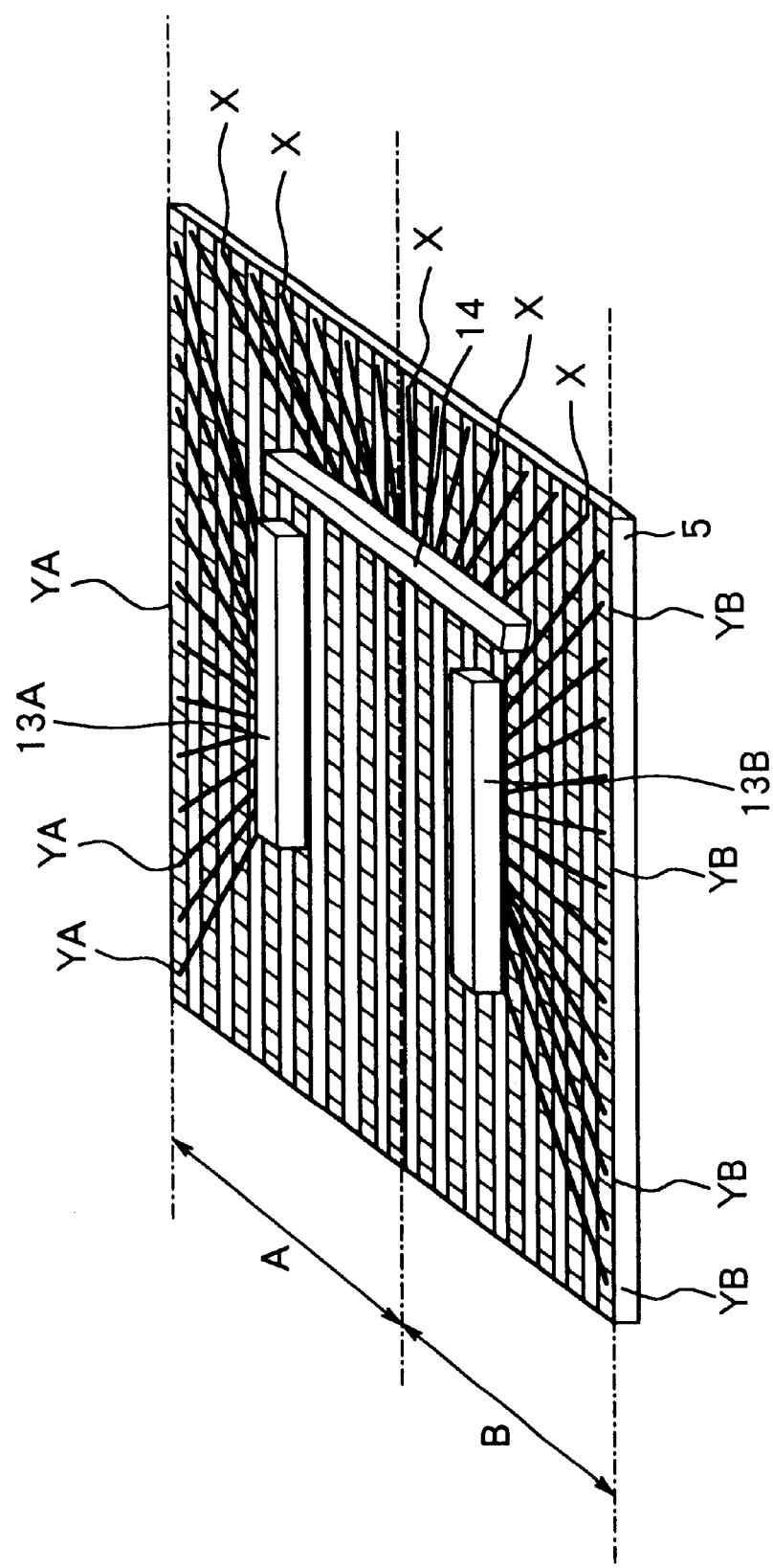
FIG. 8 is an enlarged perspective view of a part of the flat display apparatus shown in FIG 7.

FIG. 8 is a view showing the wiring at the inside of the cap 12 of the organic EL panel apparatus 11 shown in FIG. 7. FIG. 9 is a sectional view of the organic EL display apparatus 11, particularly, the illustration of the connection between the column electrodes YA, YB and the connectors 13A and 13B, and between the row electrodes X and the connector 14.

Figure 9:
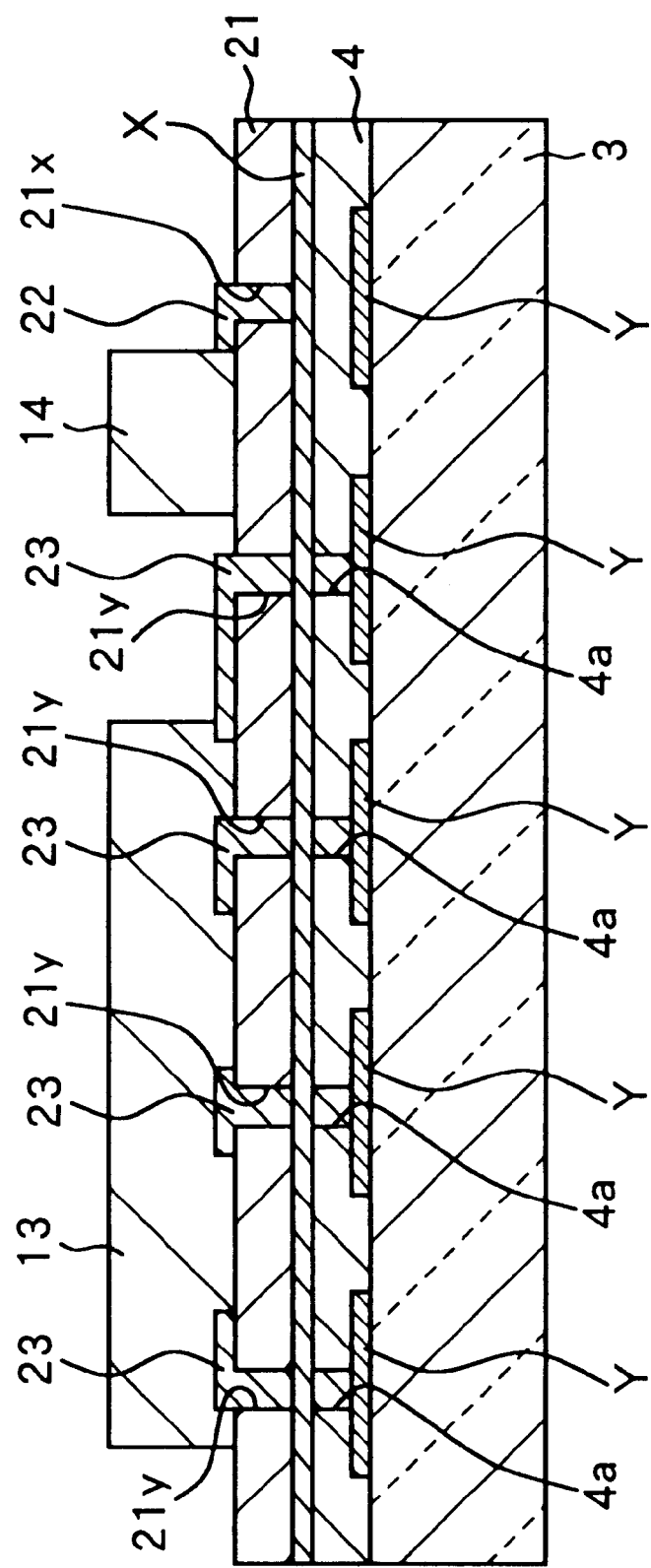
FIG. 9 is a sectional view of the flat display apparatus shown in FIG. 7.

As shown in FIG. 9, a protection layer 21 made of electrical insulation material is formed on the rear surface of the organic EL display apparatus 11, i.e., on the row electrodes X. The holes 21x are formed in the protection layer 21, inside of the cap 12 and at the position just above the row electrodes X.

The protection layer 21 is not shown in FIG. 8, but, the connector 14 and the bottom portions of the holes 21x for the row electrodes X are connected by wirings 22 formed on the surface of the protection layer 21 and inside of the holes 21x. So, the scanning signals output from the row electrode driver ICs 18 are supplied to the row electrodes X through the bottom portions of the holes 21x, functioning as the feeding portions.

As shown in FIG. 9, in the protection layer 21X, and inside of the cap 12, the holes 21y are apertured at the positions which are positioned just above the column electrodes Y and are apart from just above the row electrodes X. Holes 4a are aperture to the column electrodes Y at the positions immediately below of the holes 21y of the organic layer 4 of the organic EL display apparatus 11.

As shown in FIGS. 8 and 9, the connector 13 and the bottom portions of the holes 4a of the column electrodes Y are connected by the wiring 23 formed on the surface of the protection layer 21 and inside of the holes 21y and 4a. So, the display signals output from the column electrode driver ICs 15 are supplied to the column electrode through the bottom portions of the holes 21y, functioning as the feeding portions (feeding positions).

The wiring process applied for forming the organic EL display apparatus 11 shown in FIGS. 8 and 9 will be described.

The protection layer 21 functioning as a mask pattern and through which the holes 21x, and 21y are previously formed, is formed on the row electrodes X by printing such as a photo engraving, vacuum deposition, chemical vapor growth deposition (CVD) or the like. Of course, before that process, the organic layer 4 provided with the holes 4a and used for the mask pattern are formed.

Alternatively, the protection layer 21 in which the holes are not formed, is first formed and then the holes 21x and 21y in the protection layer 21 and the holes 4a in the organic layer 4 can simultaneously be perforated by the beams of the eximer laser.

The portions for perforating the holes 21x can be any positions where the cap 12 when they are positioned inside of the cap 12 covers the rear side of the organic EL display apparatus 11, and they are positioned at the immediately above the row electrodes X. Preferably, such the perforation positions can be the positions apart from the positions intersecting the column electrodes Y and the row electrodes X to thereby prevent the damage or fault on the picture elements during the wiring process. The perforation positions of the holes 21y can be any positions positioned immediately above the column electrodes Y and apart from the immediately above the row electrodes X, and inside of the cap 12 when the cap 12 covers the rear surface of the organic EL display apparatus 11.

Next, by soldering or using the conductive adhesive agent, the connections 13A, 13B and 14 are fixed and mounted on the protections layer 21, and by printing, the wirings 22 and 23 are formed on the protection layer 21. This process can be carried in the same way for mounting the electronic parts on the pictured circuit board and wiring the same. Note, the organic EL is deteriorated its performance when the EL is heated over 100° C., the formation of the wirings 22 and 23 should be carried out by a low temperature process lower than 100° C. and using silver-epoxiy material, or the like.

By the above processes, the wirings are formed to the organic EL display apparatus 11, as shown in FIGS. 8 and 9.

Thereafter, the rear surface of the organic EL display apparatus 11 is covered by the cap 12, and the connectors 13A, 13B and 14 pass through the holes 12ya, 12yb and 12x. Then, the portions contacting the connections 13A, 13B and 14 in the holes 12ya, 12yb and 12x and the cap 12, and the portions contacting the organic EL display apparatus 11 and the cap 12 are sealed by adhesive agent or material having a high sealing performance and a low water penetration (passing) performance (water free performance), such as epoxy resin, to seal the inside of the cap 12 against the outside. As a result, the migration of the wiring can be prevented.

The performance of the organic EL may be rapidly deteriorated by exposing it in high humidity and/or oxygen atmosphere, therefore, the above process for forming the protection layer 21 to the sealing should be preferably carried out in a deoxygen atmosphere such as a dried nitride filled atmosphere.

As described above, in the second embodiment, the signal electrodes are divided into two regions, and the feeding portions for the respective regions signal electrodes are arranged on the rear surface of the display panel, as a result, the drive circuits can be arranged at any positions where the spaces (or the flames) around the display panel are not needed.

According to the second embodiment, even where the plurality of flat display apparatuses each having the two divided signal electrodes are arranged in the tile assembling manner to assemble the large flat display apparatus, such large flat display apparatus can provide a large continuous image.

A third embodiment of the present invention will be described with reference to FIGS. 10 and 11.

In the third embodiment, the signal electrodes are divided into two regions, the feeding portions for the plurality of signal electrodes are integrated at one portion, and the drive circuits are arranged on the rear surface of the display panel.

Figure 10:
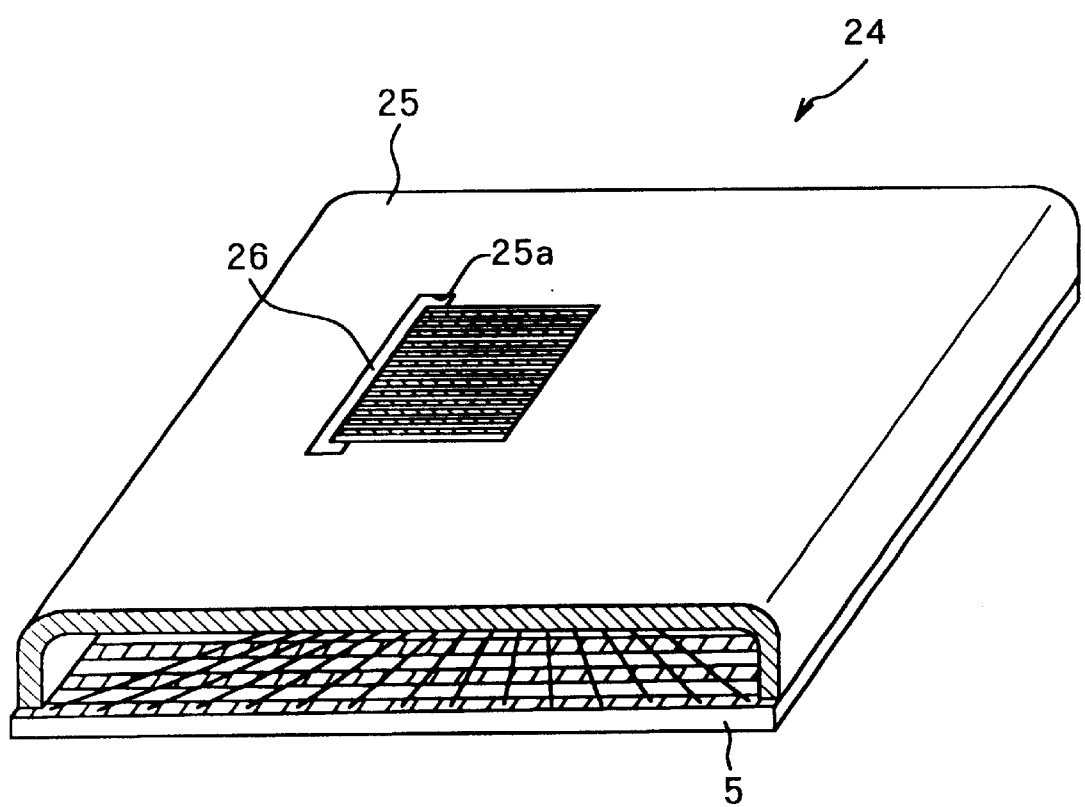
FIG. 10 is a perspective view of a third embodiment according to the present invention.

FIG. 10 is a perspective view of the rear side of an organic EL display apparatus 24. FIG. 10 also shows a partial sectional view.

The rear surface of the organic EL display apparatus 24 (the upper side surface shown in FIG. 10) is covered by a sealing cap 25. The cap 25 is of a high sealing member such as an aluminum plate, iron plate, glass plate, or the like.

Connectors 26 which connect the drive circuits for the column electrodes YA, YB and the row electrodes X with power supply circuits and circuits for supplying signals are exposed at the rear surface of the organic EL display apparatus 24 through holes 25a perforated in the cap 25 and having the size approximately same to that of the connector 26. The connectors 26 is connected with the power supply circuits and the signal supplying circuits by a FPC board (substrate) 27.

The desiccation (drying) agent and oxidation prevention agent, not shown, are provided on the inner surface of the cap 25 by painting the same.

Figure 11:
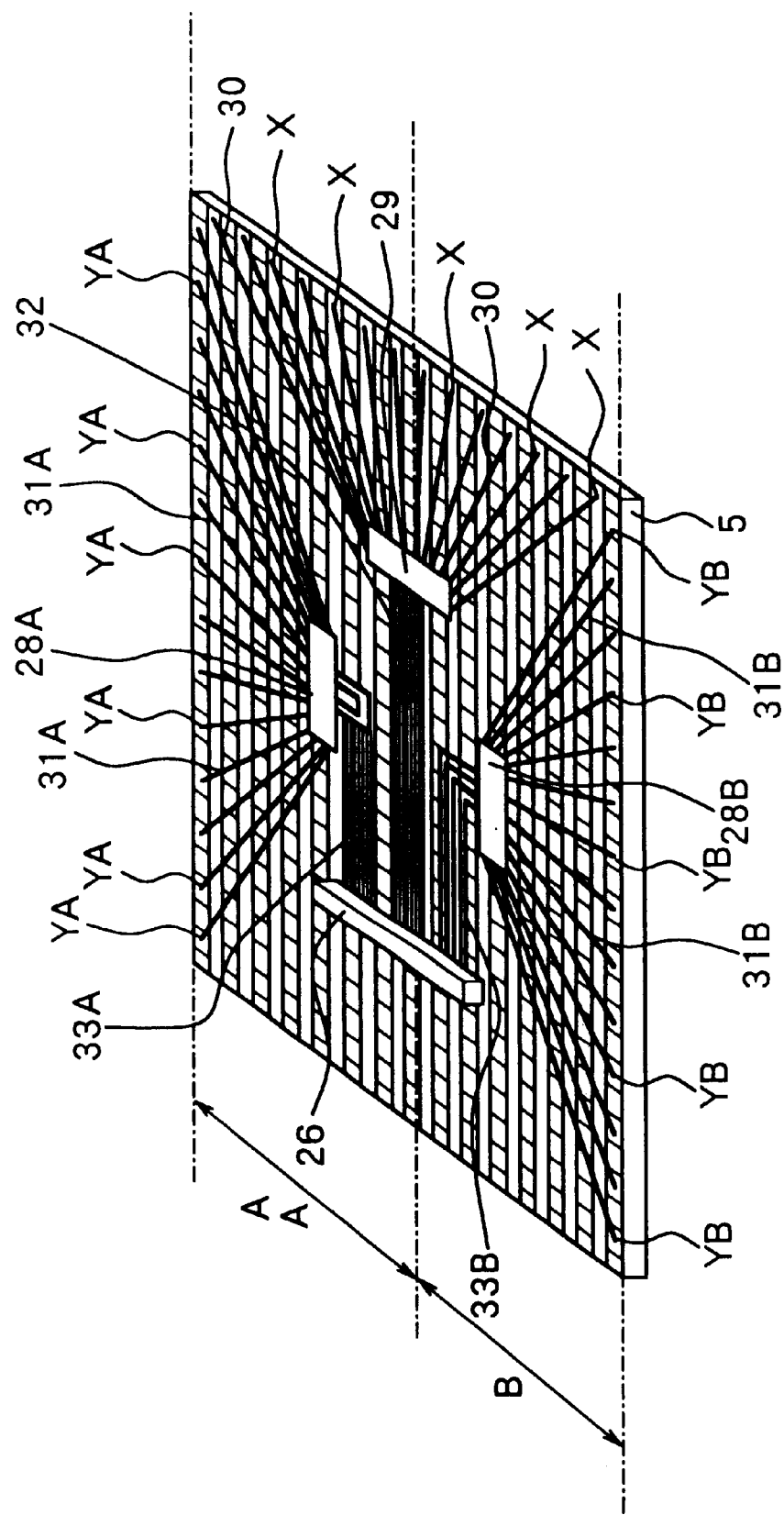
FIG. 11 is an enlarged perspective view of a part of the flat display apparatus shown in FIG. 10.

FIG. 11 is a view showing the wirings inside of the cap 25 of the organic EL display apparatus 24 shown in FIG. 10.

A protection layer not shown in FIG. 11 and made of electric insulation material is formed on the rear surface of the organic EL display apparatus 24, i.e., on the row electrodes X. The connectors 26, the column driver ICs 28A and 28B and the row driver IC 29 are mounted on the protection layer and inside of the cap 25.

The organic layers of the protection layer and the organic EL display apparatus 24 are provided with holes similar to those shown in FIG. 9 in the second embodiment. The row electrode driver ICs 29 and the bottom portions of these holes of the row electrodes X are connected by the wirings 30 formed on the surface of the protection layer and in the holes. Also, the column electrodes driver ICs 28A and 28B are the bottom portions of those holes are connected by the wirings 31A and 31B formed on the surface of the protection layer and in the holes.

On the surface of the protection layer, the wiring 32 for connecting the row electrode driver ICs 29 to the connections 26, and the wirings 33A and 33B for connecting the column electrode driver ICs 28A and 28B to the connectors 26 are formed. The row electrode driver ICs 28A and 28B are connected with the power supply circuits and signal supplying circuits, not shown, through the connectors 26.

According to the above mentioned structure, the row electrodes X are supplied with the scanning signals from the row electrode driver ICs 29 through the bottom portions of the holes, as the feeding portions. Also, the column electrodes YA and YB are supplied with the display signals from the column electrode driver ICs 28A and 28B through the bottom portions of the holes, as the feeding portions.

The wiring process applied for forming the organic EL display apparatus 24 shown in FIG. 11 can be carried out in the same way to that of the second embodiment in which the wirings shown in FIGS. 8 and 9 are applied to the organic EL display apparatus 24, except that the electric parts mounted on the protection layer and the wirings are different to those.

According to the third embodiment, it is not only the wirings for connecting between the electrodes and the drive circuits thereof are positioned inside of the sealing member, but also the drive circuits, per se, are placed inside of the sealing member, and thus the deterioration of the drive circuits by an ambient air can be prevented and the wiring work for supplying the electric power and the signals to the display panels becomes simple.

In the second and third embodiments, the descriptions of the driving method of the signals is omitted, but, in the second and third embodiments, such the method is similar to that of the first embodiment.

In the above description, the organic EL display apparatuses were considered as the preferred embodiments of the present invention, but the present invention is not limited to the application of the organic EL display apparatus and can be widely applied to many kind of flat display apparatus, such as a non-organic EL display apparatus.

While the invention has been described with reference to the specific embodiment chosen for purpose of illustration, it should be apparent that numerous modifications could be made thereto by those skilled in the art without departing from the basic concept and scope of the invention.

What is claimed is:

1. A flat display apparatus comprising:
   a plurality of scanning electrodes arranged in rows, said rows being divided into two or more regions with the scanning electrodes in each region being driven by a independent scanning driver;
   a plurality of signal electrodes arranged in columns intersecting said plurality of scanning electrodes forming lattice pattern, said columns being divided into two or more regions allowing said lattice pattern to be divided into four or more sub-regions with the signal electrodes in each sub-region being driven by an independent signal driver;
   wherein a plurality of display signals drive the independent signal drivers;
   wherein a selection of the scanning electrode is defined as the product of the inverse of the number of rows in each row region and the number of column regions; and
   wherein the scanning electrodes are arranged in a way not related to the columns defined by the signal electrodes.

2. A flat display apparatus according to claim 1, wherein a plurality of access holes are provided on a posterior of a display panel of said flat display apparatus and said signal drivers and said scanning drivers are connected to the corresponding signal electrodes in each sub-region at said access holes.

3. A flat display apparatus comprising:
   a display panel in which a plurality of signal electrodes and a plurality of scanning electrodes are arrayed forming a lattice pattern, said scanning electrodes are arranged in rows, said rows being divided into two or more regions with the scanning electrodes in each regions being driven by an independent scanning driver, and said signal electrodes are arranged into columns, said columns being divided into two or more regions, and
   said lattice pattern is divided into four or more sub-regions with each sub-region being driven by a independent signal driver; and
   a plurality of access holes located on a posterior of the flat display apparatus which give the signal and scanning drivers an opening in which the drivers can connect to their respective electrodes without using the sides of the display as a connection point;
   wherein a selection time of the scanning electrode is defined as the product of the inverse of the number of rows in each row region and the number of column regions; and
   wherein the scanning electrodes are arranged in a way not related to the columns defined by the signal electrodes.

4. A flat display apparatus comprising:
   a display panel in which a plurality of signal electrodes and a plurality of scanning electrodes are arrayed forming a lattice pattern, said scanning electrodes are arranged in rows, said rows being divided into two or more regions with the scanning electrodes in each region being driven by an independent scanning driver, and said signal electrodes are arranged into columns, said columns being divided into two or more regions, and said lattice pattern being divided into four or more sub-regions with each sub-region being driven by an independent driver; and a plurality of access holes located on a posterior of the flat display apparatus which give the signal and scanning drivers an opening in which the drivers can connect to their respective electrodes without using the sides of the display as a connection, wherein a plurality of display signals drive said independent signal drivers;

wherein a selection time of the scanning electrode is defined as the product of the inverse of the number of rows in each row region and the number of column regions; and wherein the scanning electrodes are arranged in a way not related to the columns defined by the signal electrodes.

* * * * *